United States Patent
Perin et al.

(10) Patent No.: US 11,545,982 B2
(45) Date of Patent: Jan. 3, 2023

(54) TYPE-I PLLS FOR PHASE-CONTROLLED APPLICATIONS

(71) Applicant: NXP B.V., Eindhoven (NL)

(72) Inventors: Mathieu Perin, Cairon (FR); Stefano Dal Toso, Antibes (FR); Khurram Waheed, Austin, TX (US); Claudio Gustavo Rey, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/656,124

(22) Filed: Mar. 23, 2022

(65) Prior Publication Data

US 2022/0321132 A1    Oct. 6, 2022

(30) Foreign Application Priority Data

Mar. 23, 2021 (EP) .................................... 21305357

(51) Int. Cl.
*H03L 7/085* (2006.01)
*H03L 7/099* (2006.01)

(52) U.S. Cl.
CPC .............. *H03L 7/085* (2013.01); *H03L 7/099* (2013.01)

(58) Field of Classification Search
CPC ................................ H03L 7/085; H03L 7/099
See application file for complete search history.

(56) References Cited

U.S. PATENT DOCUMENTS

| 5,214,617 | A | * | 5/1993 | Rouquette ................ G01V 1/38 367/124 |
| 6,236,343 | B1 | | 5/2001 | Patapoutian |
| 6,765,435 | B2 | | 7/2004 | Karlquist |
| 8,154,329 | B2 | | 4/2012 | Ecklund et al. |
| 8,228,128 | B2 | | 7/2012 | Chang et al. |

(Continued)

FOREIGN PATENT DOCUMENTS

DE    10049988 A1    5/2002
EP    3751303 A1    12/2020
(Continued)

OTHER PUBLICATIONS

Huang et al.: "Low-Noise Fractional-N PLL With a High-Precision Phase Control in the Phase Synchronization of Multichips," IEEE Microwave and Wireless Components Letters, vol. 28, Issue: 8, Aug. 2018, pp. 702-704.

(Continued)

*Primary Examiner* — Adam D Houston

(57) ABSTRACT

A type I phase locked loop (PLL) includes an oscillator and a feedback path to a phase detector. The PLL is configured to lock a first frequency and first relative phase of a first output signal to a frequency and a phase of a first input signal, and lock a second frequency and second relative phase of a second output signal to a frequency and a phase of a second input signal. A steady state phase lag of the PLL resulting from the difference between the first frequency and the second frequency is estimated, and the estimated steady state phase lag is used to determine a total phase shift ($\Delta\Phi_{LO,steady}$) between the second input signal and the second output signal. The PLL for the phase shift can be compensated. The determined total phase shift can be used in a distance estimation.

20 Claims, 7 Drawing Sheets

(56) References Cited

U.S. PATENT DOCUMENTS

| | | | |
|---|---|---|---|
| 9,231,605 B2 | 1/2016 | Ainspan et al. | |
| 9,350,296 B1 | 5/2016 | Waheed et al. | |
| 9,723,580 B2* | 8/2017 | Boehlke | H04R 5/04 |
| 10,158,366 B2* | 12/2018 | Galton | H03L 7/193 |
| 10,680,622 B2* | 6/2020 | Monk | H03L 7/085 |
| 10,756,739 B1* | 8/2020 | Coban | H02M 3/07 |
| 11,277,143 B1* | 3/2022 | Kundu | H03L 7/093 |
| 11,283,459 B1* | 3/2022 | Monk | H03L 7/085 |
| 11,296,806 B2* | 4/2022 | Coulter | H04J 3/0673 |
| 11,387,833 B1* | 7/2022 | Li | G04F 10/005 |
| 11,431,342 B2* | 8/2022 | Midha | H03L 7/0891 |
| 2003/0103475 A1* | 6/2003 | Heppe | H04W 56/006 |
| | | | 370/321 |
| 2008/0136535 A1* | 6/2008 | Khorram | H03L 7/193 |
| | | | 331/44 |
| 2010/0315140 A1* | 12/2010 | Mayer | H03L 7/099 |
| | | | 327/159 |
| 2014/0347109 A1* | 11/2014 | Rey | H03L 7/0802 |
| | | | 327/159 |
| 2015/0145571 A1* | 5/2015 | Perrott | G04F 10/005 |
| | | | 327/551 |
| 2015/0200770 A1* | 7/2015 | Rahbar | H04L 7/0331 |
| | | | 375/376 |
| 2016/0285467 A1* | 9/2016 | Reddy | H03L 7/093 |
| 2016/0336923 A1* | 11/2016 | Seedher | H03L 7/0891 |
| 2017/0214408 A1* | 7/2017 | Liang | H03L 7/099 |
| 2017/0324419 A1 | 11/2017 | Mayer et al. | |
| 2018/0097522 A1* | 4/2018 | Chillara | H03L 7/0991 |
| 2018/0212611 A1* | 7/2018 | Shen | H03L 7/0898 |
| 2019/0280698 A1* | 9/2019 | Kearney | H03L 7/0814 |
| 2019/0319722 A1 | 10/2019 | Yu | |
| 2019/0362110 A1* | 11/2019 | Chahal | G06K 19/07309 |
| 2021/0215814 A1* | 7/2021 | Guan | A01M 1/023 |
| 2021/0239826 A1* | 8/2021 | Tertinek | H04B 1/38 |
| 2021/0243716 A1* | 8/2021 | Ma | G01S 11/02 |
| 2022/0066019 A1* | 3/2022 | Waheed | G01S 13/825 |

FOREIGN PATENT DOCUMENTS

| | | |
|---|---|---|
| KR | 101483855 B1 | 1/2015 |
| WO | WOD-1994014244 A1 | 6/1994 |
| WO | WOD-2007137094 A2 | 11/2007 |

OTHER PUBLICATIONS

Seong et al.: "A -242-dB FOM and -71-dBc reference spur ring-VCO-based ultra-low-jitter switched-loop-filter PLL using a fast phase-error correction technique," IEEE 2017 Symposium on VLSI Circuits, Jun. 5-8, 2017, Kyoto, Japan, pp. C186-C187.

Tan et al.: "Phase Mismatch Detection and Compensation for PLL/DLL Based Multi-Phase Clock Generator," IEEE Custom Integrated Circuits Conference 2006, Sep. 10-13, 2006, San Jose, CA, USA, pp. 417-420.

* cited by examiner

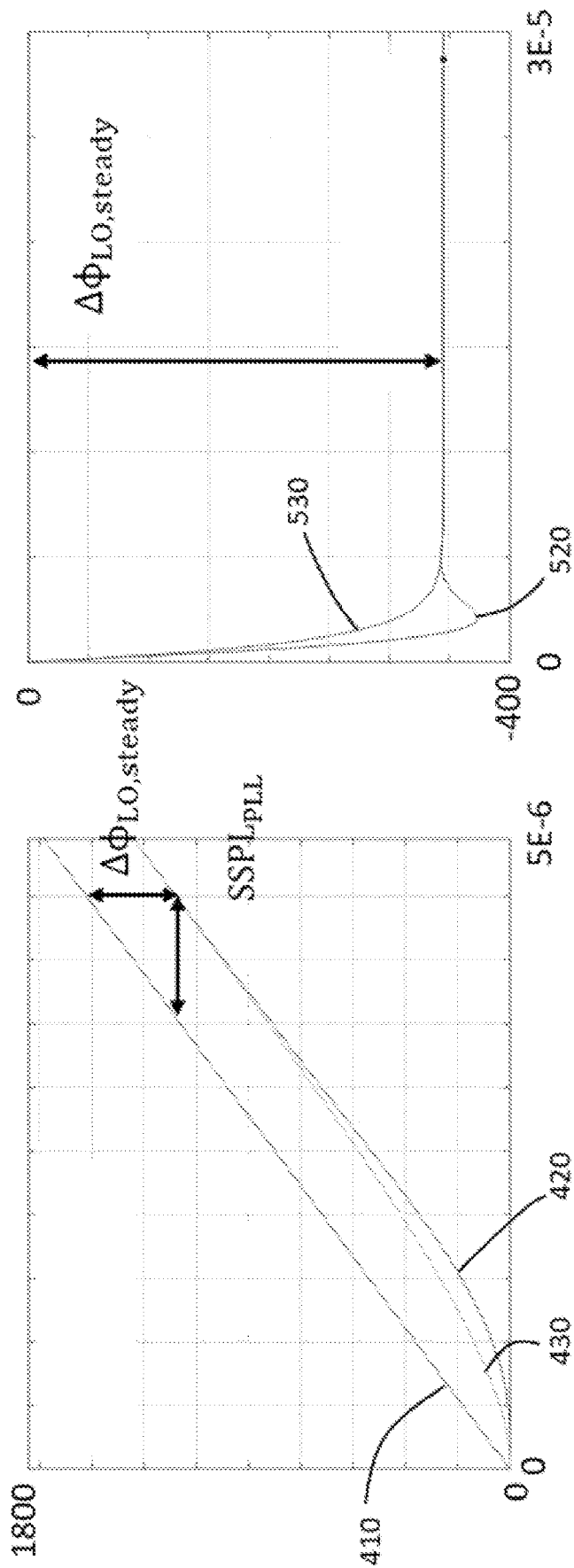

TYPE-I PLLS FOR PHASE-CONTROLLED APPLICATIONS

CROSS-REFERENCE TO RELATED APPLICATIONS

This application claims the priority under 35 U.S.C. § 119 of European Patent application no. 21305357.2, filed on 23 Mar. 2021, the contents of which are incorporated by reference herein.

FIELD

The present invention relates to phase locked loops, PLL, and in particular to applications in which phase coherence of a signal must be maintained, or be well-controlled, across different frequencies.

BACKGROUND

A non-limiting example of a phase-controlled application is phase-based distance estimation. Phase-based distance estimation (PDE) is becoming of increasing interest in a wide range of use cases such as car and home access, security, asset location and tracking, and the like. PDE using narrowband technologies such as Bluetooth low energy (BLE) is, for example, is expected to be included in an upcoming version of Bluetooth specifications under IEEE 802.15.1.

PDE measures the distance between two wireless devices, an initiator device and a reflector device. The simplest form of PDE relies on the reliable measurement of the changes in phase of wireless unmodulated pulses sent by the initiator as it is bounced back from a passive reflector device. If the reflector is an active device, it may actively send response pulses back and perform what is known as a two-way ranging measurement. Alternatively, the reflector device may not send response pulses and just measure the phases of the incoming pulses, this is known as a one-way phase ranging measurement.

In two-way ranging (TW PDE) it is required that the unmodulated phase of transmit (TX) and receive (RX) PLL remain coherent when switching from RX to TX and vice-versa. In some types of transceiver, the TX and RX frequencies are the same, so this becomes relatively straightforward to achieve. Such receivers are called direct conversion receivers or zero-IF receivers. However, use of the same frequency for both transmit and receive introduces its own problems, and so increasingly popular is the use of receivers in which the TX and RX frequencies are offset by a chosen intermediate (IF) frequency that is later compensated through a digital mixer. These receivers may be termed low-IF receivers, and in this instance a phase compensation technique is required to enable bilateral coherent phase measurement. Coherency must be maintained between the transmitter PLL phase and the receiver signal after digital downmixing. Here, "frequency" refers to the frequency of the local oscillator (LO), which corresponds to the PLL operating frequency, divided by the "LO divider" (if any).

In one-way phase-distance estimation ranging, or unilateral measurement, the phase coherence requirement extends to the PLL such that it must maintain its phase coherent irrespective of the frequency.

In all such ranging methods, a phase difference between transmissions over the same distance at two different frequencies is inversely proportional to the difference between the frequencies. Thus at least two frequencies are required, to determine a phase-distance estimation, and in practical applications, typically more than two are used, and the frequencies are switched or hopped randomly, or pseudo-randomly, in order to improve the measurement robustness and provide security against, for instance, malicious jamming.

The problem of phase coherence across frequency has been solved by applying so-called type-II PLLs in the receiver circuit. type II PLLs have a phase-error integration block within the PLL loop. As a result, there is a closed loop for controlling the phase and achieve a null phase offset, even in the event of perturbations to phase or frequency of the incoming input signal.

However, the phase error integration block results in relatively longer lock times, increases the in-band noise, and adds to the power consumption and size of the semiconductor die. It would therefore be desirable to achieve phase coherence, reducing or mitigating at least some of the above disadvantages.

Another known approach is to operate a type I PLL as a "pseudo type-II" PLL. Typically, these are implemented as a fast-locking all-digital ADPLL and appear similar to a type-I PLL having a type-I PLL phase, but they engage a digital integrator to regulate the PLL phase-error around a sampled non-zero phase-error. In such a PLL the samples' phase error value (acquired at the end of type-I phase control) is variable and so the PLL cannot maintain phase coherency across frequency jumps.

SUMMARY

According to a first aspect of the present disclosure, there is provided a method of using a type I phase locked loop, PLL, comprising an oscillator and a feedback path to a phase detector, the method comprising of an estimation of a phase correction term $\Delta\Phi_{LO,steady}$ that is applied to correct for the output of a Type 1 PLL so that it can be used as a coherent type 2 PLL. One such application for this innovation is that of distance estimation, either 1way or 2way, for wireless devices using a low IF architecture with a Type 1 PLL can provide the advantage of effectively operating as a type 2 PLL.

Thus, according to this aspect it may be possible to avoid a requirement to include a phase error integration block in the PLL, such is used in type II PLLs. In particular, the present inventors have appreciated that, in a type I PLL, the phase lag resulting from a frequency change settles down to a steady state, and this fact may be exploited in order to provide well-controlled phase, and effectively provide the equivalence of phase coherent phase memory without requiring the additional circuitry of type II PLL's In one or more embodiments, determining the total phase shift ($\Delta\Phi_{LO,steady}$) comprises determining a self-resonance frequency, $F_{VCO}$, of the oscillator, and an offset, $F_{ERR}$, between the self-resonance frequency, and a one of the first and second frequencies $F_{PLL}$. The oscillator may be a voltage-controlled oscillator (VCO). It has thus been found that the value $F_{ERR}$, where $$F_{ERR} = F_{PLL} - F_{VCO},$$

is one of the parameters which determines the SSPL and thus the total phase shift.

In one or more embodiments, determining the total phase shift ($\Delta\Phi_{LO,steady}$) comprises determining a PLL gain, $K_{PLL}$. Furthermore, in one or more embodiments, determining the total phase shift ($\Delta\Phi_{LO,steady}$) comprises determining an open-loop gain Ko of the oscillator by operating the PLL in an open loop configuration wherein the feedback path is disconnected from the phase detector. Moreover, in one or more such embodiments the PLL gain is equal to the open-loop gain of the oscillator multiplied by a gain, $K_\Phi$, of a phase detector of the PLL. It can be demonstrated by mathematical analysis that the SSPL depends on the open loop gain of the oscillator.

In one or more embodiments, the PLL is operable in an open-loop configuration in which an output of the phase detector is replaced by a predetermined pre-charge signal. As will be described in more detail hereinunder, the PLL may be operated in such a so-called "open-loop" configuration, in which the frequency of the oscillator is not determined by a feedback path, but by a predetermined signal. The predetermined signal is used to pre-charge the oscillator. In an analogue PLL the pre-charge signal is typically a pre-charge voltage, and may have a level which is half of supply voltage. In a digital PLL, the pre-charge signal is typically a value of a register held in memory and applied as a digital control word applied to a tuning input of the oscillator, which in this case is typically a digitally controlled oscillator.

Once the total phase shift is known, this may be used for example in calculations in which the phase of the signal is required to be known or to either correct or compensate the PLL directly. Thus, in one or more embodiments the method comprises compensating the PLL for the phase shift.

In one or more such embodiments, the feedback path comprises a fractional divider controlled by a sigma-delta modulator, and compensating the PLL for the phase shift comprises applying a correction dependent on the total phase shift ($\Delta\Phi_{LO,steady}$) to the fractional divider by means of a sigma-delta modulator. As will be familiar to the skilled person, the feedback path of the PLL typically requires a fractional divider which may be controlled by a Sigma-Delta modulator.

In one or more embodiments, applying a correction dependent on the total phase shift ($\Delta\Phi_{LO,steady}$) to the sigma-delta modulator comprises applying an impulse signal to the sigma-delta modulator.

In one or more embodiments, the PLL is a digital PLL and the impulse comprises a frequency control word, FCW.

In one or more other embodiments, in which the determined total phase shift is used in a phase-based distance estimation (PDE), the method comprises—Phase-based distance estimation methods determine the separation between two objects, such as the first and second devices mentioned above by comparing the phase of an electromagnetic signal transmitted between the two objects at the moment of transmission and the moment of reception. Any phase lag introduced by circuit elements—such as the phase lag from the PLL—is an undesired term which can interfere with this calculation, and thus is preferably removed. Whereas constant elements may be subtracted out by difference calculations, elements of which vary introduce additional complexities. By recognising that a change in frequency induces a phase lag which, in steady state, is dependent on analogue parameters which may be estimated, the complexity associated with the PLL may be reduced or eliminated.

In one or more embodiments, the PDE is a one-way PDE, and the second frequency is related to the first frequency by a frequency hop. Herein the phrase "frequency hop" refers equally to the action of hopping between two channels—sometimes as part of a larger frequency sweep—or the separation between those channels, particularly adjacent channels. (Naturally, hopping between non-adjacent channels is also possible resulting in larger frequency changes.)

The skilled person will appreciate that in one-way PDE, multiples frequencies are used in order to provide differing received phases associated with the differing wavelengths of the two different frequencies, from which the transmitter-receiver separation can be determined. Typically, for communication in the 2.4 GHz range, the minimum frequency hop, between adjacent channels, may be of the order of 1 MHz. For other communication frequency ranges, the frequency hop and/or the minimum frequency hop may each have different values.

In one or more other embodiments, the PDE is a two-way PD, and the first frequency is a receiver local oscillator, LO, frequency for a channel, and the second frequency is a transmitter LO frequency for the channel. The difference between the LO frequencies in receive mode and transmit mode is called the intermediate frequency, IF. Typically, for communication in the 2.4 GHz range, the intermediate frequency is 1 MHz. In other embodiments, such as for other communication frequency ranges, the intermediate frequency may have a different value. The skilled person will appreciate that in two-way PDE, multiple frequencies are used, separated by a frequency hop in order to provide differing received phases associated with the differing wavelengths of the two different frequencies. Each frequency hop is performed in a "there-and-back" communication between the two devices whose spatial separation is to be calculated. The two channel frequencies correspond to two separate wavelengths and thus two separate "round-trip" received phases back at the transmitter which started the two-way communication, from the combination of which the separation between the two devices can be determined. It will be appreciated that for this measurement to be effective, it is necessary to quantify any impact from the role swap from transmitter-to-receiver, and associated LO frequency change, corresponding to the frequency offset required for the LO in the "receive" mode, in order to provide the heterodyne intermediate frequency from the received signal.

This second summary refers to invention 2. Both summaries will be retained in both applications.

According to another Aspect of the present disclosure, there is provided a method of using a type I phase locked loop, PLL, comprising an oscillator and a feedback path to a phase detector, PDE, the method comprising: locking a first frequency and first relative phase of a first output signal to a frequency and a phase of a first input signal; locking a second frequency and second relative phase of a second output signal to a frequency and a phase of a second input signal; and a one of: adjusting the second relative phase to equal the first relative phase, and adjusting the oscillator frequency, by applying a correction to the PLL. Thus according to this aspect, insight about the phase change, and or the frequency change which causes the phase change, can be applied, in order to compensate the change. It will be noted that the method does not require a second control loop in the PLL— in other words, it can be applied to a true type-I PLL. Such methods can thereby facilitate use of a type-I PLL in applications for which phase-coherency is required, which application hereto for have required the use of type-II PLLs, or other relatively complex circuitry, in order to maintain phase coherency.

In one or more embodiments in which the method includes the step of adjusting the second relative phase to equal the first relative phase, applying a correction to the PLL comprises inserting the correction signal into the feedback path. Such embodiments may be referred to in general as Low Port Modulation compensation methods, since the LPM input to a PLL loop is included in the feedback path.

In one or more such embodiments the feedback path includes a fractional divider controlled by a Sigma Delta Modulator (SDM), and inserting the correction signal into the feedback path comprises inserting the correction signal into the fractional SDM.

In one or more embodiments, the correction signal is inserted into the feedback path in the form of an impulse signal in a single clock cycle. In other embodiments, the correction signal is inserted into the feedback path through a plurality of partial corrections signal is applied over multiple clock cycles, such that the product of the partial correction signals and the number of clock cycles that that partial crash supplied sums to the correction signal.

In one or more embodiments determining the correction signal effected by: estimating a steady state phase lag of the PLL resulting from the difference between the first frequency and the second frequency, and using the estimated steady state phase lag, to determine a total phase shift m ($\Delta\Phi_{LO,steady}$) between the second input signal and the second output signal.

In one or more embodiments, determining the total phase shift ($\Delta\Phi_{LO,steady}$) comprises further comprises determining a self-resonance frequency, $F_{VCO}$, of the oscillator, and an offset, $F_{ERR}$, between the self-resonance frequency, and a one of the first and second frequencies $F_{PLL}$.

In one or more embodiments, determining the total phase shift ($\Delta\Phi_{LO,steady}$) comprises determining an PLL gain, $K_{PLL}$. Furthermore, determining the total phase shift ($\Delta\Phi_{LO,steady}$) may comprise determining an open-loop gain $K_O$ of the oscillator by operating the PLL in an open loop configuration wherein the feedback path is disconnected from the phase detector. Yet further, in one or more embodiments, the PLL gain is equal to the open-loop gain of the oscillator multiplied by a gain, $K_\Phi$, of a phase detector of the PLL.

In one or more embodiments, the PLL is operable in an open-loop configuration in which an output of the phase detector is replaced by a predetermined pre-charge signal.

According to a yet further aspect of the present disclosure, the above method includes the step of adjusting the oscillator frequency. Such embodiments may generally be referred to, or considered as, using HPM correction or HPM compensation. In one or more such embodiments, the oscillator includes a control port for receiving an input for tuning the oscillator, and applying a correction to the PLL comprises adjusting a control signal at the control port.

In one or more embodiments, the PLL is an analog PLL comprising a modulation digital-to-analog converter, DAC. In such embodiments, it may be that the control port is a varactor tuning port having an input connected to the output of the modulation DAC, and adjusting a control signal at the control port PLL comprises controlling the modulation DAC. In one or more such embodiments, the modulation DAC includes at least one of a gain stage, and an anti-alias filter.

In one or more embodiments using HPM correction or compensation, the method includes the step of adjusting the oscillator frequency and wherein the oscillator is a digitally controlled oscillator, DCO having a port for high port modulation, the embodiments include applying a correction to the PLL comprises adjusting a control signal at the port for high port modulation.

In one or more embodiments adjusting a control signal at the port for high port modulation comprises adjusting the control signal by an amount corresponding to an intermediate frequency which is a difference between the first frequency and the second frequency. This adjustment to the frequency—in the frequency domain—nullifies the phase offset with the change in PLL frequency from the first to second locked frequencies, and avoid the needs for a second, phase, control loop (i.e. avoids the need for use of a type-II PLL).

In one or more such embodiments, the PLL includes a feedback divider connected between an output of the oscillator, and an output of the PLL, and the method includes adjusting a control signal at the port for high port modulation comprises adjusting the control signal by an amount corresponding to an intermediate frequency which is a difference between the first frequency and the second frequency, divided by a division factor of the feedback divider.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as another non-transient signal.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIG. 4 shows a comparison between the response of an example PLL to a 1 MHz frequency step, and the response of an ideal frequency modulator to the same step;

FIG. 5 plots, for the same example PLL, the relative phase shift to the same step response;

Figure 1:
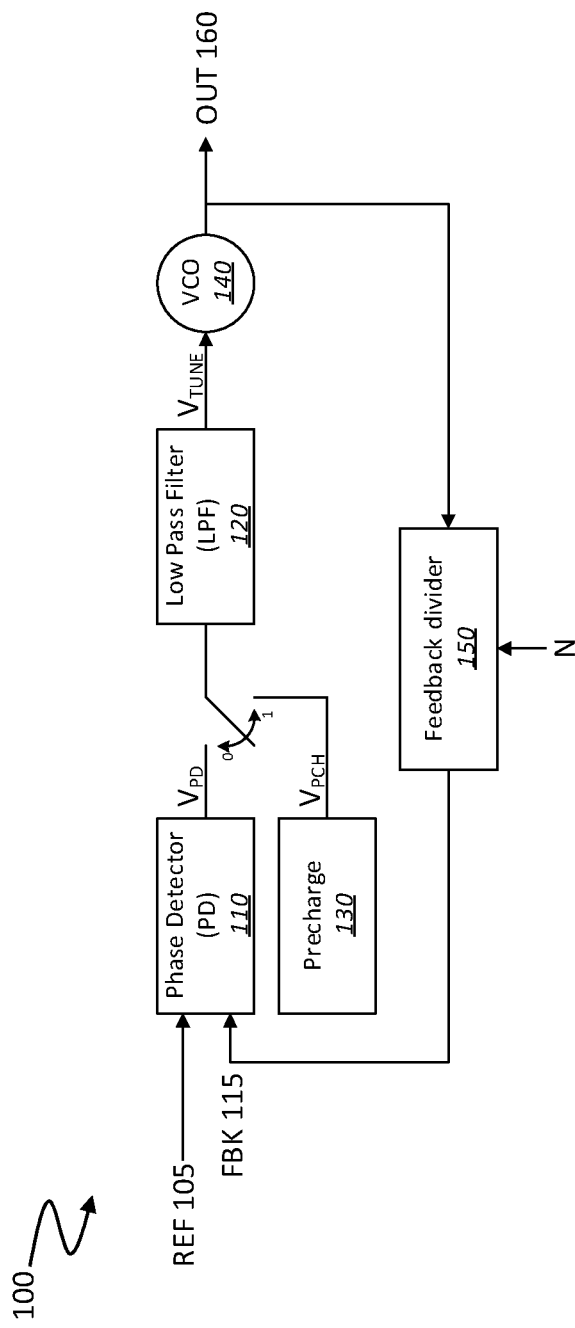
FIG. 1 illustrates a type I PLL configured for initial phase locking.

It should be noted that the figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

As mentioned above, type I PLLs differ from type II PLLs by the absence of a phase-error integration block in the PLL loop, other than the voltage controlled oscillator (VCO).

This is axiomatic, since one definition of the "type" of a PLL is that it corresponds to the number of integrators in the loop: for example, there may be just the VCO for a type-I PLL and the VCO plus one other, for a type-II PLL. Thus there can be a variable phase error between the phase detector reference and the output signal—which is returned as the feedback signal. By avoiding a phase-error integration block, the above-mentioned disadvantages associated with using type II PLLs may be reduced or avoided: in particular faster locking times and/or a better trade-off between noise and power may be achievable, and the PLL occupies a small area on a die.

However, there are some applications, such as PDE or narrowband ranging the mentioned above for which a variable phase error is not generally acceptable. For such applications which require "phase coherence" or "phase memory" it would generally be considered that type I PLLs are not appropriate. As a specific example, within PDE it is required to manage a role swap—that is to say the transceiver switching between a receive mode to a transmit mode with associated frequency change—for two-way PDE without introducing a phase error, and similarly for one-way PDE it is required to be able to manage frequency hops again without introducing phase error.

The present inventors have appreciated that it is possible to mitigate or compensate the dynamic frequency error which is introduced when hopping, or role-swapping, between frequencies; thereby it may be possible to reduce or overcome the disadvantages of type-I PLLs, and facilitate their use in a wider range of applications. In particular, it may thereby be possible to benefit from other advantages of type I PLLs, such as speed of convergence and lower noise. The phase error introduced through a frequency hop may be defined as a "transient phase error", which converges to, and results in a "steady state phase lag" which will be described in more detail hereinbelow, and may be determined or estimated, again as will be detailed hereinbelow.

Considering first FIG. 1, this shows a type I PLL configured for initial phase locking. The PLL 100 comprises a phase detector (PD) 110 into which is input a reference signal (REF) 105 during normal operation. An output $V_{PD}$ from the phase detector 110 is input into a low pass filter (LPF) 120. However during the initial phase, this connection is opened—such that the loop is not closed. Instead a pre-charge voltage $V_{PCH}$ is input to the lowpass filter 120 from a pre-charge unit 130. High frequency components are filtered out by the low-pass filter 120, which passes a tuning voltage $V_{TUNE}$ to a VCO 140. The output from the VCO is both provided as output (OUT) 160 and fed back as a feedback signal. The feedback signal is divided by a factor (which may be a factor of as shown) in a feedback divider 150, and provided as the second, FBK, input to the phase detector 110.

During the initial phase, known as an open-loop VCO calibration, the VCO is brought to a self-resonance frequency—which is generally designed to be close or as close as possible to the target PLL frequency. The skilled person will appreciate that how this is achieved is dependent on the specific implementation of hardware used. For instance, there may a capacitor bank controlled by a calibration algorithm. In this phase $V_{TUNE}=V_{PCH}$; this is typically chosen to be half the PLL supply voltage ($V_{DD\text{-}PLL}$), to maximise the PLL acquisition range. Once the open-loop calibration ends, the loop is closed, and the VCO control voltage $V_{TUNE}$ is set by the PLL to drive the VCO to the correct frequency. In normal operation, the phase detector 110 produces an output that is proportional to the phase difference between the two inputs signals REF and FBK. Thus $V_{PD}=K_\Phi \cdot (\Phi_{REF}-\Phi_{FBK})$ where $\Phi_{REF}$ and $\Phi_{FBK}$ are the phases of the signals REF and FBK respectively and $K_\Phi$ is the Phase Detector gain (in V/rad).

At the end of the open loop calibration, the frequency of the VCO will differ from the target PLL by a frequency error: $F_{VCO}=F_{PLL}+F_{ERR}$; where $F_{PLL}$ is the target PLL frequency, $F_{ERR}$ is the frequency error with respect to the target PLL output frequency and $F_{VCO}$ the VCO self-resonance frequency. Once the loop is closed, the PLL drives the VCO frequency to the desired value, by acting on the VCO control voltage, until the VCO frequency achieves the locked frequency $F_{VCO\text{-}LCK}=F_{PLL}$. The VCO control voltage then, $V_{TUNE\text{-}LCK}$, will be related to the pre-charge voltage $V_{PCH}$, through:

$$V_{TUNE\text{-}LCK}=V_{PCH}-F_{ERR}/K_{VCO},$$

where $K_{VCO}$ is the VCO gain in Hz/V.

Consider the example above in which the pre-charge voltage is half the supply voltage: $V_{PCH}=V_{DD\text{-}PLL}/2$, and assume that the Phase Detector is implemented by a set-reset (SR) latch:

$$V_{PD}=V_{DD\text{-}PLL}/2\pi \cdot (\Phi_{REF}-\Phi_{FBK}) \text{ and } K_\Phi=V_{DD\text{-}PLL}/2\pi.$$

If the initial frequency error is null ($F_{ERR}=0$), then $V_{TUNE\text{-}LCK}=V_{PCH}=V_{DD\text{-}PLL}/2$ and $(\phi_{REF}-\phi_{FBK})=\pi$. However, is the frequency error is not null, then:

$$V_{TUNE\text{-}LCK}=V_{PCH}-F_{ERR}/K_{VCO}=V_{DD\text{-}PLL}/2-F_{ERR}/K_{VCO},$$

From which it follows that $$(\phi_{REF}-\phi_{FBK})=\pi-F_{ERR}/(K_\Phi \cdot K_{VCO}))=\pi-F_{ERR} \cdot 2\pi/(V_{DD\text{-}PLL} \cdot K_{VCO})$$

Since the phase of the feedback signal is equal to the phase of the PLL output signal divided by N, then also the phase of the PLL output signal depends on the VCO frequency error.

Now considering a frequency hop of $\Delta f$ whilst the PLL is operating—i.e. in closed loop; the resulting relative phase shift (in steady state) at the Phase Detector inputs is:

$$\Delta\phi=\Delta f/(K_\Phi \cdot K_{VCO})=\Delta f \cdot 2\pi/(V_{DD\text{-}PLL} \cdot K_{VCO})$$

Due to its limited bandwidth, the PLL will take some time to arrive to steady state, but once in steady state a phase shift at the phase detector feedback input is related to a phase shift on the LO (local oscillator—in this example the VCO) signal.

Figure 2:
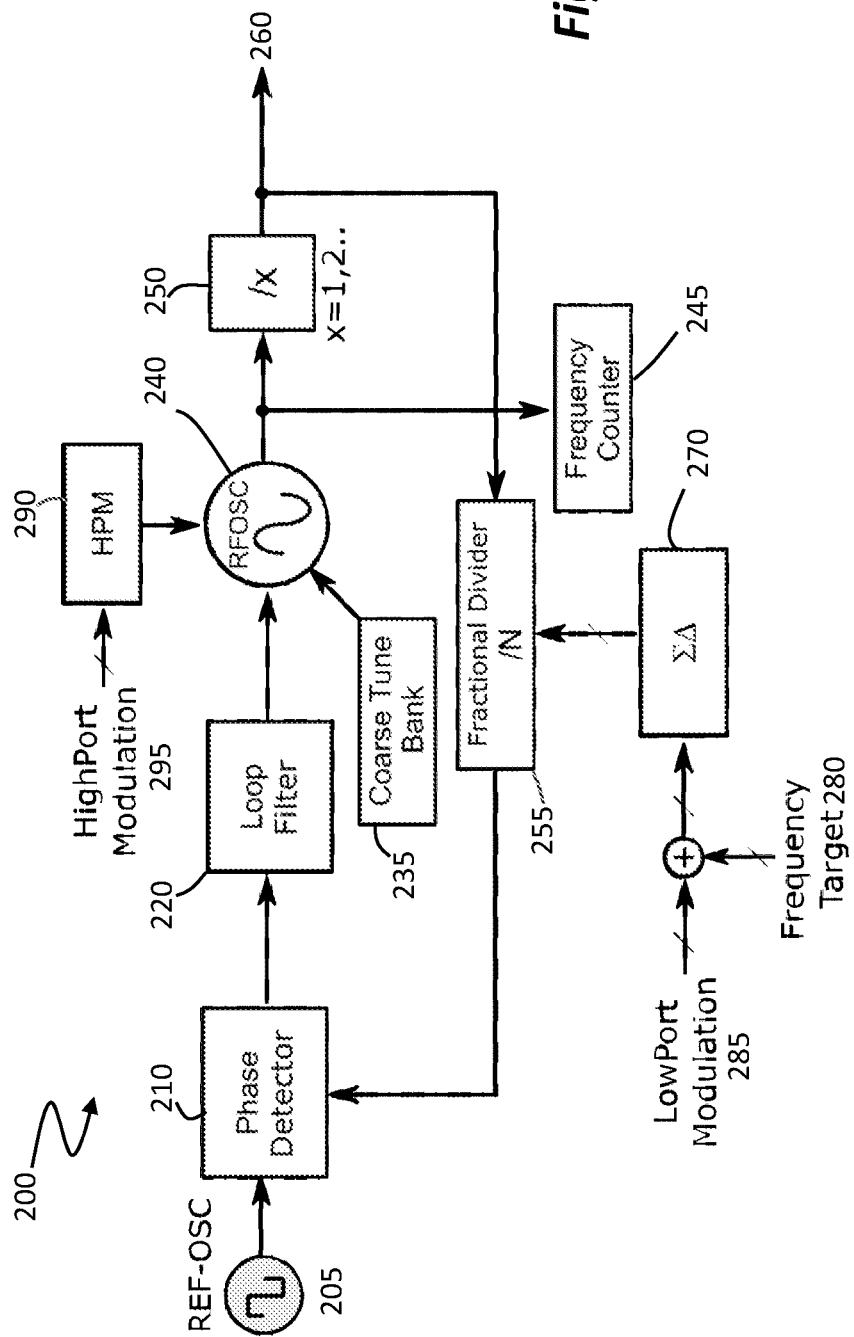
FIG. 2 is a block diagram depiction of a generic divider-based PLL.

Before returning to a circuit analysis, the reader is directed to FIG. 2 which is another block diagram depiction of a generic divider-based PLL 200, which can be implemented either as an analog or digital circuit, and illustrates two modulation ports for modulation the frequency of the PLL: a low port modulation and a high port modulation. Similar to the PLL shown in FIG. 1, the loop comprises a phase detector 210, the output of which is input to a loop filter 220. The output of the loop filter 220 is input to an oscillator 240, in this instance implemented as an RF oscillator. A frequency counter 245 counts the oscillator output. There is included between the oscillator and the output 260 an optional divide-by-x divider 250. Feedback is provided from the output, through a divide by N fractional divider 255, back to the phase detector 210. Along with the feedback, the phase detector has a second input REF-OSC 205. The fractional divider 250 has as an input a (in this case digital) signal output from a Sigma Delta modulator 270. The input and Sigma Delta modulator is the sum of a target frequency 280 and a low port modulation input, if any, as shown at 285. The RF oscillator 240 can be controlled by a course tuning block 235; it can be further directly by a high port modulation 290 provided by a high port modulation input 295.

Figure 3:
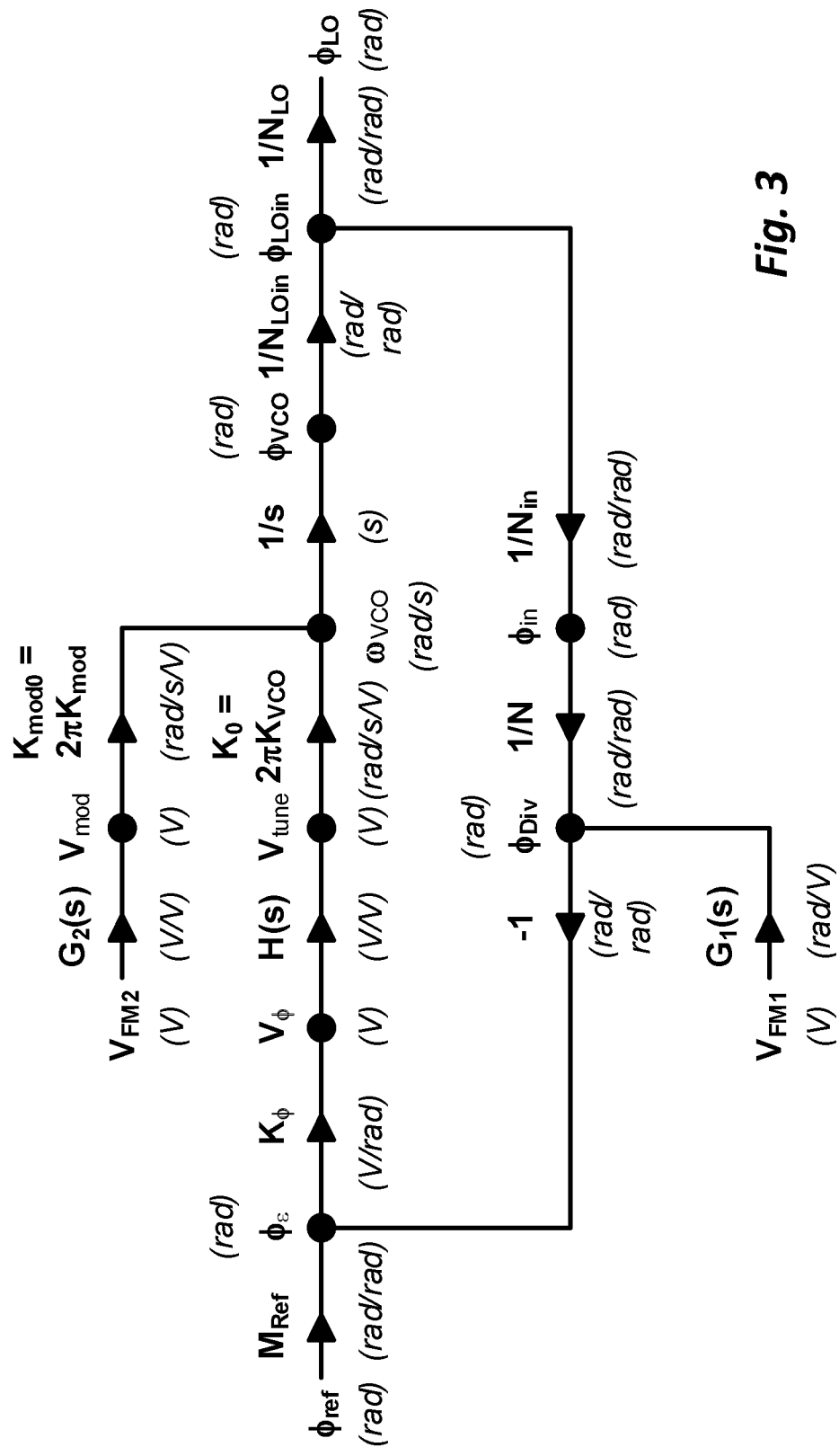
FIG. 3, shows a generic flow graph of a divider-based analog PLL, such as that shown in FIG. 2.

A theoretical analysis of the transfer function of the PLL, over a Laplace domain s can be made, in conjunction with FIG. 3, which shows a generic flow graph of a divider-based analog PLL, such as that shown in FIG. 2, including a divide-by-N divider in the feedback path, and the option of providing both "low-port injection" and "high-port injection"—which will be explained in more detail hereinbelow. It can be shown that, considering firstly the effect of controlling using $V_{FM1}$ corresponding to a frequency modulation control signal through the Low-Port Modulation path 285, 270:

$$\frac{\omega_{LO}}{V_{FM1}}(s) = \frac{1}{N_{LO}} \cdot \frac{-G_1(s) \cdot K'_0 \cdot K_\phi \cdot H(s) \cdot N_{in} \cdot N \cdot s}{N_{in} \cdot N \cdot s + K'_0 \cdot K_\phi \cdot H(s)},$$

and secondly the effect of controlling using $V_{FM2}$ corresponding to a frequency modulation control signal through the High-Port Modulation path 290

$$\frac{\omega_{LO}}{V_{FM2}}(s) = \frac{1}{N_{LO}} \cdot \frac{G_2(s) \cdot K'_{mod0} \cdot N_{in} \cdot N \cdot s}{N_{in} \cdot N \cdot s + K'_0 \cdot K_\phi \cdot H(s)}$$

where: s is the Laplace variable; $N_{in}$ is a fixed division ratio (if any) in front of the feedback divider, and N is the division ratio of the feedback divider. Finally, G is a scaling or gain factor in the Laplace domain.

Since in the present instance $V_{FM1}=V_{FM2}=V_{FM}$, and $G_1(s)=G_2(s)$, this results in an all-pass transfer function (i.e. a transfer function allowing for injections signals from both the low pass modulator and the high pass modulator, $V_{FM1}$, and $V_{FM2}$ respectively), for the combination of high port modulation HPM and low port modulation LPM:

$$\frac{f_{LO}}{V_{FM}}(s) = 1 \Leftrightarrow \begin{cases} LPM(s) = \frac{f_{LO}}{V_{FM1}}(s) = \frac{K'_0 \cdot K_\phi \cdot H(s)}{N_{div} \cdot s + K'_0 \cdot K_\phi \cdot H(s)} = \\ \quad \frac{1}{1 + \frac{N_{div}}{K'_0 \cdot K_\phi \cdot H(s)} \cdot s} \to LPF \\ HPM(s) = \frac{f_{LO}}{V_{FM2}}(s) = \frac{N_{div} \cdot s}{N_{div} \cdot s + K'_0 \cdot K_\phi \cdot H(s)} = \\ \quad \frac{\frac{N_{div}}{K'_0 \cdot K_\phi \cdot H(s)} \cdot s}{1 + \frac{N_{div}}{K'_0 \cdot K_\phi \cdot H(s)} \cdot s} \to HPF \end{cases}$$

In the above relation, $N_{div}=N_{in} \cdot N$, $K'_0=K_0/N_{LOin}$ and $K'_{mod0}=K_{mod0}/N_{LOin}$ It will be appreciated that the above analysis can be broadened to include generic divider-based digital PLL and a generic counter-based digital PLL. In all cases, it results that a similar transfer function exists and a similar dependence on the open-loop gain $K'_0 \cdot K_\phi$ and feedback $N_{div}$ loop exists. Thus the above analysis, and hence embodiments of the present disclosure, are not restricted to one single kind or type of type-I PLL.

Considering next a frequency hop (which, as discussed above, may be either for role swap from receive to transmit, or for a channel change), a $\Delta f$ step will be applied to $V_{FM1}$ leading to $\Delta f/s$.

The step response of the LPM in the output frequency and phase domains are:

$$f_{LO}(s) = \frac{\Delta f}{s} \cdot \frac{1}{1 + \frac{N_{div}}{K'_0 \cdot K_\phi \cdot H(s)} \cdot s} \text{ and}$$

$$\phi_{LO}(s) = \frac{2\pi}{s} f_{LO}(s)$$

Comparing those responses to an ideal PLL, that is to say one in which the transfer function under low port modulation is unity: $LPM_{ideal}(S)=1$, it can be written:

$$\Delta\phi_{LO}(s) =$$

$$\frac{2\pi \cdot \Delta f}{s^2} \cdot \left( \frac{1}{1 + \frac{N_{div}}{K'_0 \cdot K_\phi \cdot H(s)} \cdot s} - 1 \right) = -\frac{2\pi \cdot \Delta f}{s} \cdot \frac{\frac{N_{div}}{K'_0 \cdot K_\phi \cdot H(s)}}{1 + \frac{N_{div}}{K'_0 K_\phi \cdot H(s)} \cdot s}$$

Applying the Final Value Theorem to obtain the steady state values gives:

$$\Delta\phi_{LO,steady} = \lim_{t \to +\infty} \Delta\phi_{LO}(t) = \lim_{s \to 0} s \cdot \Delta\phi_{LO}(s) = -2\pi \cdot \Delta f \cdot \frac{N_{div}}{K'_0 \cdot K_\phi}$$

That is to say, the steady state phase lag, $SSPL_{PLL}$ is a function of $N_{div}$, and $K'_0 \cdot K_\phi$, since the SSPL may be defined as:

$$SSPL_{PLL} = \frac{\Delta\phi_{Lo,steady}}{2\pi \cdot \Delta f} = -\frac{N_{div}}{K'_0 \cdot K_\phi}$$

A phase shift, having a value:

$$-2\pi \cdot \Delta f \cdot \frac{div}{K'_0 \cdot K_\phi}$$

is thus introduced by the frequency hop, and is proportional to the frequency step and inversely proportional to the PLL open loop gain. The present inventors have appreciated that this relationship can be exploited to enable use of a type-I PLL, in application where the phase should be well-controlled.

In the case respectively of a set-reset-latch-based or XOR-gate-based Phase Detector, the above analysis is modified such the phase shift is $$-2\pi \cdot \Delta f \cdot \frac{N_{div}}{K_{VCO} \cdot V_{DD}} \text{ and}$$

$$-2\pi \cdot \Delta f \cdot \frac{N_{div}}{2 \cdot K_{VCO} \cdot V_{DD}},$$

respectively.

Taking as a specific and non-limiting example, a set-reset-latch-based PD, and a 1 MHz frequency step, for a $N_{div}$ of 75.625, $K_{VCO}=86$ MHz/V, and $V_{DD}=0.918$ V, a phase shift of $-344.85°$ is obtained. Using these parameters, the PLL SSPL in this case is equal to $-957.909$ ns.

Turning now to FIGS. 4 and 5, FIG. 4 shows the response of an example PLL to a 1 MHz frequency step, for an ideal frequency modulator shown at 410, that is to say the open-loop VCO response measured as the relative phase to the initial carrier phase, measured in degrees, on the y-axis or ordinate against time in seconds on the x-axis or abscissa. In addition to the open-loop VCO response 410, the figure shows a simulated response of a real system at 420, and a first order approximation at 430.

FIG. 5 plots, for the same example, the relative phase shift to the same step response, with the relative phase shift in degrees plotted on the y-axis or ordinate, against time on the x-axis or abscissa. The simulated real circuit is shown at 520 along with the first order approximation at 530.

As can be seen in FIG. 4, the SSPL PLL for this example is approximately 1 µs, and $\Delta\phi_{LO,steady}$ can be seen in both FIGS. 4 and 5 to be approximately 345°.

Returning to the analysis, and now focusing on the digital part of the PLL implementation: in addition to the steady state phase lag from the PLL, the digital data-path latency or delay to apply the frequency step (Digital Sigma Delta modulator+PLL main divider) must be taken into account. This will be implementation dependent, and denoted $-N_{Dig} \cdot T_{PLL,Ref}$, where $N_{Dig}$ is a counter value of the digital path latency or in other words, a number of clock cycles for an input sample to be available at the system output, $T_{PLL,Ref}$ is the PLL reference clock period and is equal to $1/(M_{ref} \cdot f_{XO})$, where $f_{xo}$ is the frequency of the crystal oscillator (in embodiments in which one is used), or another clock at the PLL input, and Mref is the PLL input clock multiplication ratio in case of a frequency multiplier is used in front of the phase detector. (it will be appreciated that this could, alternatively, be a divider or even a cascade of one and/or several multipliers/dividers.

Then due to the type I operation, there is a phase offset in between the PLL reference clock running at $M_{ref} \cdot f_{XO}$ and the feedback clock. Typically, the feedback clock is an image of the clock of the delta-sigma modulator (DSM) in the feedback divider part of the loop, but is NOT directly the DSM clock. The phase offset depends on the initial frequency error in open loop for the pre-charge voltage $V_{pch}$, the frequency hop and the nominal phase offset required by the Phase Detector, which is either $V_{pch} \cdot \pi/V_{DD}$ for a XOR-based phase detector, or
$V_{pch} \cdot 2\pi/V_{DD}$ for a SR-based phase detector.
which leads to $(F_{ERR}-\Delta f)/(K_{VCO} \cdot K_\phi) - V_{pch} \cdot (2\pi/\alpha)/V_{DD}$,
where $\alpha=1$ for a XOR phase detector, and $\alpha=2$ for a SR-based phase detector.

This phase offset can be converted to a delay:

$((F_{ERR}-\Delta f)/(2\pi/\alpha) \cdot K_{VCO} \cdot K_\phi) - V_{pch}/V_{DD}) \cdot T_{PLL,Ref}$ There is also a time delay in between the DSM clock rising edge and feedback clock edge which is also implementation dependent, and denoted by $-\Delta t_{clk}$ The total SSPL is thus:

$$SSPL = -\frac{N_{div} + \frac{\Delta f - F_{ERR}}{M_{ref} \cdot f_{XO}}}{a\pi \cdot K_{VCO} \cdot K_\phi} - \frac{V_{pch}/V_{DD} + N_{Dig}}{M_{ref} \cdot f_{XO}} - \Delta t_{clk}$$

And the total corresponding phase shift is:

$$\Delta\phi_{LO,steady} = 2\pi \cdot \Delta f \left( -\frac{N_{div} + \frac{\Delta f - F_{ERR}}{M_{ref} f_{XO}}}{a\pi \cdot K_{VCO} \cdot K_\phi} - \frac{V_{pch}/V_{DD} + N_{Dig}}{M_{ref} \cdot f_{XO}} - \Delta t_{clk} \right)$$

It can be observed that the first term depends on analog variables and the two last terms are constant and deterministic. Thus the two last terms can be known or removed by performing a so-called "zero-metre distance calibration" of PDE-based algorithm, in other words a calibration ofr the case in which there is no separation between the transmitter and receiver. The first term on the other hand requires a way to estimate the unknowns $F_{ERR}$, $K_{VCO}$ and $K_\phi$ Parameter Estimation $F_{ERR}$ can be estimated based on the best-achieved, or best achievable, frequency error during VCO coarse tune calibration (that is to say, when using the coarse tuning bank 235 to adjust the oscillator RFOSC 240). Alternatively, it can be estimated based on an acquisition using a ripple counter or similar apparatus which is able to estimate the open-loop VCO frequency.

To estimate the PLL gain ($K_{PLL}$) several alternatives will be readily appreciated. One is to use a method which directly allows computation of a ratio between a phase delta and a frequency delta, such as $1/(K_\phi \cdot K_0) = \Delta\phi/\Delta f$.

Another is to use a method which exploits gain estimator results such as, for a DPLL, $1/(K_\phi \cdot K_0) = 1/\check{K}_{TDC} \cdot 1/(2\phi \cdot \check{K}_{DCO})$.

A specific example for an analog PLL is as follows: choose a pair of VCO pre-charge values equally distributed around default pre-charge voltage but not too far away to avoid seeing varactor non-linearity, e.g. $V_1=0.4 \cdot V_{DD}$ and $V_2=0.6 \cdot V_{DD}$ for a default of $0.5 \cdot V_{DD}$; measure VCO frequencies through a frequency-calibration (FOAL) or Ripple counter for both pre-charge voltages, which yields $f_1$ & $f_2$ respectively for $V_1$ & $V_2$; and then use the approximate relationship:

$$K_{PLL} = K_\phi \times K_0 = \alpha V_{DD}/(2\pi) \times 2\pi(f_2 - f_1)/(V_2 - V_1) =$$
$$\alpha V_{DD}(f_2 - f_1)/(V_2 - V_1) = \alpha(f_2 - f_1)/0.2)$$

where, $\alpha$ is a constant which depends on the PD implementation: e.g. $\alpha=1$ for Set-Reset latched-based PD, $\alpha=2$ for XOR-gate PD)

In digital PLLs: estimators for the PLL gain ($K_\phi \cdot K_0$) parameter are typically directly available: Time-to-Digital Converters (TDC) and DCO gains can be generally estimated using Least-Mean-Square (LMS)-based or similar algorithms, respectively providing $1/\check{K}_{TDC}$ and $1/\check{K}_{DCO}$, leading to a direct availability of the loop gain parameter through:

$1/K_\phi \cdot K_0) = 1/\check{K}_{TDC} 1/(2\pi \cdot \check{K}_{DCO})$

Computation of SSPL and Total Phase Shift.

From $F_{ERR}$ and $K_{PLL}$ estimation, it is possible to compute SSPL as discussed above:

$$SSPL = -\frac{N_{div} + \frac{\Delta f - F_{ERR}}{M_{ref} \cdot f_{XO}}}{K_{PLL}},$$

And the total phase shift that needs to be compensated is, correspondingly:

$$\Delta\phi_{LO,steady} = 2\pi \cdot \Delta f \left( -\frac{N_{div} + \frac{\Delta f - F_{ERR}}{M_{ref} \cdot f_{XO}}}{K_{PLL}} \right),$$

where Δf is the frequency jump resulting from either the role swap in 2-way PDE, or from a frequency hop for in 1-way PDE.

Compensation Through LPM

According to one or more embodiments of the present disclosure, it is possible to compensate for a phase change in the type-I PLL which re-results from a frequency change, by providing compensation into the low port modulator LPM The PLL fractional frequency may be written as $k_{frac}*(M_{ref}*f_{XO})$.

Applying an offset:

$$k_{frac} = \frac{\Delta\phi_{LO,steady}}{2\pi} \cdot N_{LO}$$

For a single PLL reference period results in a VCO frequency shift $\Delta f_{VCO}$, where:

$$\Delta f_{VCO} = \frac{\Delta\phi_{LO,steady}}{2\pi} \cdot N_{LO} \cdot M_{ref} \cdot f_{XO},$$

Which is equivalent to a LO frequency shift:

$$\Delta f_{LO} = \frac{\Delta\phi_{LO,steady}}{2\pi} \cdot M_{ref} \cdot f_{XO},$$

Over a single reference period, which corresponds, in the phase domain, to a phase shift of $$\Delta\phi_{LO,shift} = -\frac{2\pi \cdot \Delta f_{LO}}{M_{ref} \cdot f_{XO}} = -\Delta\phi_{LO,steady}.$$

That is to say, the phase shift is perfectly compensated.

Figure 6:
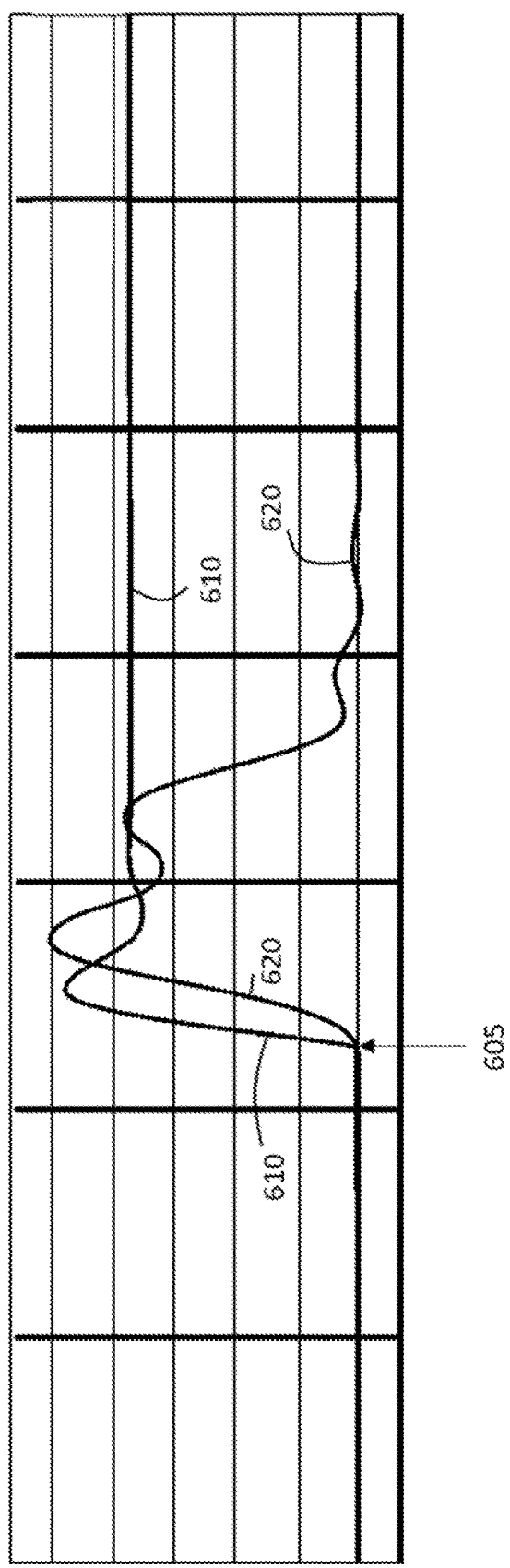
FIG. 6 illustrates a simulation of the impact of such phase correction by an impulse insertion in the feedback path.

FIG. 6 illustrates a simulation of the impact of such phase correction by an impulse insertion in the LPM, by plotting phase on the Y-axis alternate against time on the x-axis or abscissa. Plot 610 shows the change of phase resulting from a frequency step introduced at moment 605, without any correction. In contrast by including an impulse at the same moment that the frequency changes, the phase re-settles to the original value, as shown by plot 620.

Figure 7:
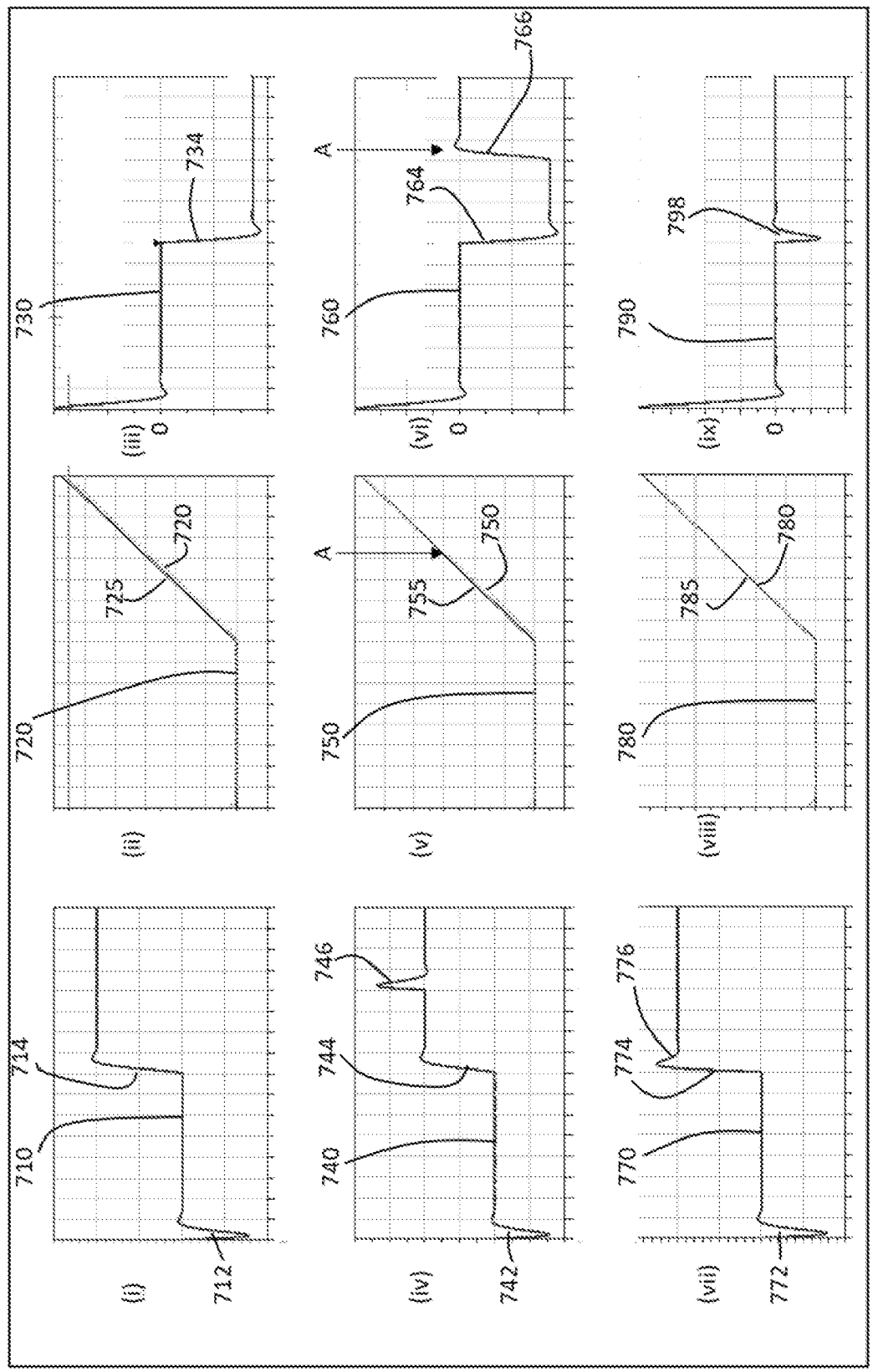
FIG. 7 shows a simulated response of a PLL to a frequency hop.

This is shown in more detail in FIG. 7. FIG. 7 shows a simulated response of a PLL to a frequency hop. The top row of graphs (i), (ii) and (iii) show the response without any compensation, at 710, 740 and 770 respectively. The middle row of graphs (iv), (v) and (vi) show the response when a compensation $\Delta\phi_{LO,shift}$ is applied, delayed after the frequency hop, both for an ideal PLL at 720, 750, 780 respectively, and for a real PLL at 725, 755 and 785 respectively. The lower row of graphs (vii), (viii) and (ix) show the response, 730, 760 and 790 respectively, when the same compensation $\Delta\phi_{LO,shift}$ is applied, at the same time as the frequency hop. For each row, the left graph shows the VCO frequency plotted against time. The middle graph shows the normalised phase of an ideal PLL compared with the real PLL, again plotted against time on the same scale, and the right graph shows the normalised phase error, once again plotted against time on the same scale.

Looking first at the frequency response over time (i), (iv) and (vii), the frequency change resulting from the frequency hop is shown at 714, 744 and 774 respectively. On each plot the phase locking is also shown on the far left at 712, 742, 772, once the open loop calibration discussed above is concluded.

Looking now at the normalised phase response of time, it can be seen that the phase is initially normalised to 0, until the frequency hop is applied. The change in frequency resulting from the frequency hop results in a steadily increasing phase, which is the same for all three plots with respect to the ideal PLL. However, looking at the response of the real PLL with no compensation in plot (ii), it can be seen that the increasing phase lags that of the ideal PLL, shown at 725, by a constant amount. In contrast, looking at the middle plot (v) in which the compensation is applied, delayed with respect to the frequency hop, it can be seen that the phase of the real PLL 750 lags that of the ideal PLL 75 until the compensation is applied, as shown at A. Thereafter, the compensated phase of the real PLL overlays that of the ideal PLL. Looking now at the lower plot (viii) which shows the normalised phase for a PLL where the conversation is applied at the same time as the frequency hop, here the normalised phase of the real PLL 780 overlays that of the ideal PLL 785 for the whole period.

Finally, looking at the right graphs which show the normalised phase error, the top plot at (iii) shows, after the phase settles, zero phase error until the frequency hop is applied at 734. Thereafter the phase settles to a steady state phase error (corresponding to the steady state phase lag discussed above). The middle plot (vi) shows the phase error, which again is 0 until the frequency hop is applied, at which moment the phase error becomes negative, and settles to a steady state phase error until the compensation is applied at moment A, at which time the phase error arises, as shown at 766, back to a zero phase error. The lower plot (ix) shows the consequence of applying the compensation at the same time as the frequency hop. Again, once the PLL has settled, the phase error 790 is 0 until the frequency hop is applied. However, in this case the compensation supplied at the same time such that after a short perturbation showed at 798, the phase error returns to 0.

The offset applied to the LPM may be provided as an impulse (that is a 1-cycle correction) or the correction may be applied over multiple cycles provided the product of the correction and the number of clock cycles is equal to the desired correction Compensation Using HPM According to one or more embodiments of the present disclosure, it is possible to compensate for a phase change in the type-I PLL which re-results from a frequency change, by providing a frequency offset into the high port modulator HPM. In the example of a digital PLL, the oscillator is a digitally controlled oscillator (DCO), and the HPM frequency offset applied needs to be equal and opposite in polarity at the voltage controlled oscillator (VCO) to the frequency change that has been commanded from the PLL (using the programmed fractional division factor). Also note that this offset may be provided as a step-change, or introduced gradually, for instance as a linear or exponential ramp.

The theory underlying this correction will now be considered:

A PLL frequency is typically applied by changing the applied fractional numerator value to the low port modulation LPM Sigma-Delta modulator, for example, for a low IF receiver, transitioning between TX and RX modes at the same channel frequency, the PLL is offset by the value of the IF frequency. This change in frequency results in a constant phase change at the PLL output (assuming that everything else remains constant), as will now be shown, which can be compensated by providing an offset into the HPM.

In the case where two injection points are well matched in gain and delay, and there is no impact from the low pass filter (in other words the anti-aliasing cut-off frequency can be ignored), then:

$$\frac{f_{LO}}{V_{FM}}(s) = 1 \text{ and } \frac{\phi_{LO}}{V_{FM}}(s) = \frac{2\pi}{s},$$

which corresponds to an ideal wideband modulator.

If we apply a step at the HPM after the LPM frequency change step the step response of the HPM transfer function can be studied:

$$f_{LO}(s) = \frac{\Delta f}{s} \cdot \frac{\frac{N_{div}}{K_0 \cdot K_\phi \cdot H(s)} \cdot s}{1 + \frac{N_{div}}{K_0 \cdot K_\phi \cdot H(s)} \cdot s} \text{ and}$$

$$\phi_{LO}(s) = \frac{2\pi}{s} f_{LO}(s).$$

Applying Final Value Theorem to obtain the steady state phase change results in:

$$\Delta\phi_{LO,shift} = \lim_{t \to +\infty} \phi_{LO}(t) = \lim_{s \to 0} s \cdot \phi_{LO}(s) = 2\pi \cdot \Delta f \cdot \frac{N_{div}}{K_0 \cdot K_\phi} = -\Delta\phi_{LO,steady}$$

From this it is seen that the magnitude of the phase change required to be applied via the HPM is proportional to the frequency shift $\Delta f$, and inversely dependent on the open-loop gain $K_0 K_\phi$. Seen from another viewpoint, this is equivalent to saying that the PLL phase change introduced by the change in the target frequency may be compensated by effectively changing the fixed VCO tank capacitance which causes the PLL loop to settle at the same operating point as it did before the frequency change. In a two-port PLL modulator, the PLL HPM port is a calibrated input that allows for introduction of a calibrated tank capacitance to the VCO core, that can be used to "perfectly" compensate for the phase change resulting from the LPM instituted PLL frequency. Put another way, the introduced HPM frequency offset compensation results in a PLL phase change (which is a function of $\Delta f$, $N_{div}$, $K_0$, $K_\phi$), which nulls another phase change due to a commanded PLL frequency change. It will be appreciated that compensation using this technique is dependent on the programmable range of the HPM—typically this range is limited to a few megahertz which would normally be adequate to compensate for an IF frequency change resulting from a TX to RX transition. It will also be appreciated that the accuracy of the compensation could be impacted by the HPM resolution and calibration accuracy.

Figure 8:
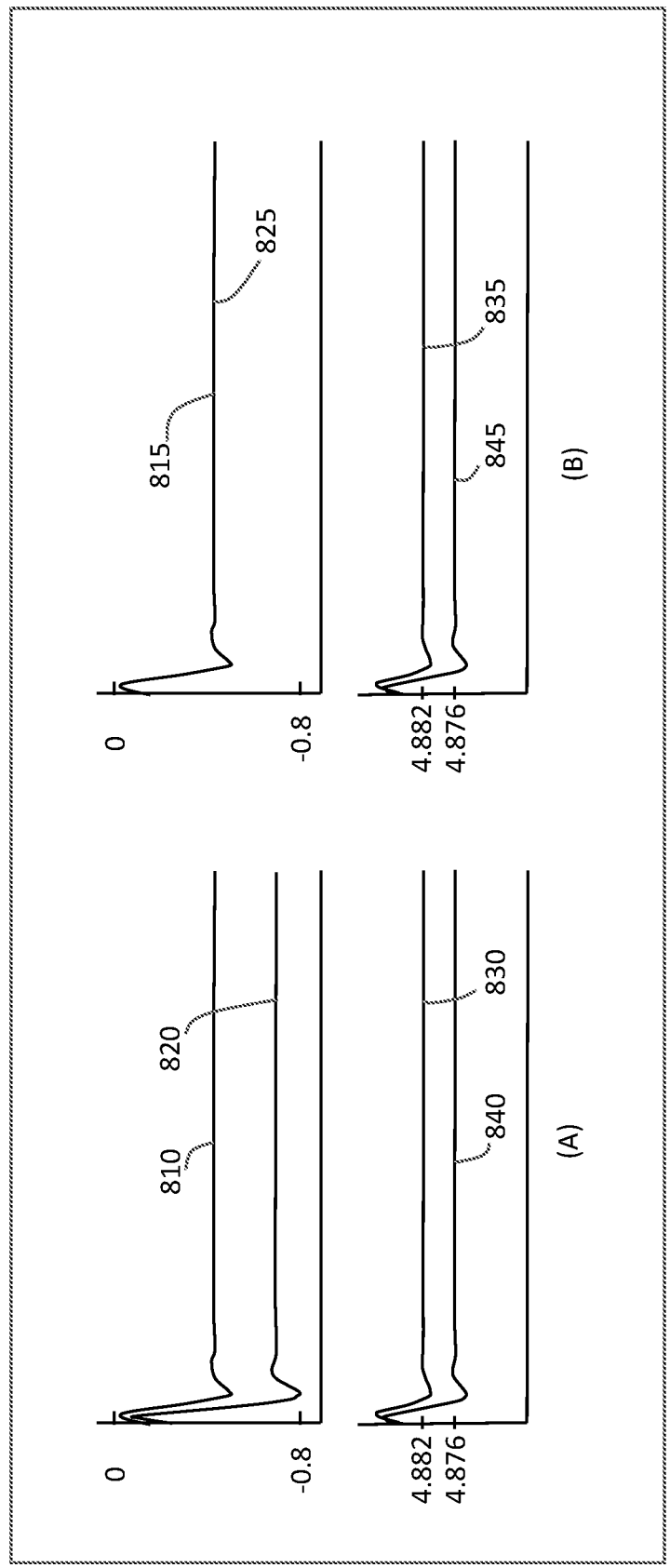
FIG. 8 shows, simulated responses of a PLL on the left-hand side, with no compensation, and including compensation in the form of an impulse modulation on HPM.

A specific example with typical values, will now be considered. In this instance, a 2.4 GHz Bluetooth-LE (BLE) radio with a receiver IF frequency of, $F_{IF}$ of −1 MHz, and a PLL feedback divider, x, of 2. Then for BLE channel 19, the TX LO (or direct launch) frequency is 2.44 GHz, and the (low-IF) RX LO frequency is 2.439 GHz. FIG. 8 shows, on the left-hand side, case A in which there is no compensation, and case B shown on the left the right-hand side, which includes an impulse modulation on HPM of $-2*F_{IF}$ that is to say 2*1 MHz.

The upper two traces of case A show the phase 810 and 820 of the transmit and receive signals at the PLL output. And the lower two traces 830 and 840 show the frequency of the VCO during transmit and receive, without the compensating HPM modulation. On the right-hand part of the figure, B shows the same transmit and receive frequency that the VCO at 835 and 845 respectively; however by including the above compensation at the HPM, the transmit and receive phase 815 and 825 respectively are seen to overlay each other, showing effectively perfect compensation.

Phase-Correction in PDE Calculation

The above examples have discussed compensating the PLL for the phase difference introduced (either by a phase-domain correction at LPM, or a frequency correction for HPM) by the frequency changes. In other embodiments, the PLL is not compensated, but the knowledge of the phase difference is used in the PDE calculation itself. This can be done for each of one-way PDE and two-way PDE.

Turning first to two-way PDE:

In two-way PDE between two devices A and B separated by a distance r, the estimated "phase distance", d, can be estimated as:

$$d = r + \frac{c}{-4\pi\Delta f} [(\phi_{TXB2} - \phi_{RXB2} + \phi_{TXA2} - \phi_{RXA2}) - (\phi_{TXB1} - \phi_{RXB1} + \phi_{TXA1} - \phi_{RXA1})]$$

Where:

$\Delta f = f_2 - f_1$ $\phi_{TXAn}$ and $\phi_{RXAn}$ are the phases of the device A LO at frequency $f_n$ in TX and RX mode respectively $\phi_{TXBn}$ and $\phi_{RXBn}$ are the phases of the device B LO at frequency $f_n$ in TX and RX mode respectively Since $\phi_{TXMn} - \phi_{RXMn} = -\Delta\phi_{LOMn,steady}$ for each of $M = A$, $$B \text{ and } n = 1, 2 = -2\pi \cdot f_{IF} \left( -\frac{N_{div} + \frac{\Delta f - f_{error}}{M_{ref} \cdot f_{XO}}}{K_{PLL}} \right),$$

or $d =$ $$r + \frac{c}{4\pi\Delta f} [(\Delta\phi_{LOB2,steady} + \Delta\phi_{LOA2,steady}) - (\Delta\phi_{LOB1,steady} + \Delta\phi_{LOA1,steady})],$$

which is of the form: $d = r + \text{error}_{\Delta\emptyset}$, where the error term $\text{error}_{\Delta\phi}$ is expressed in terms of the phase shift, and thus can be estimated using the Steady State Phase Lag concept, discussed above.

A similar analysis applies to one-way PDE. In this case:

$$d = r + \frac{c}{-2\pi\Delta f}(\phi_{TXB2} + \phi_{TXB1} - \phi_{RXA1} - \phi_{RXA2})$$

Knowing that:

$$\phi_{TX2} + \phi_{TX1} = \Delta\phi_{LOTX,steady} = -2\pi\Delta f \left( -\frac{N_{div} + \frac{\Delta f - f_{error}}{M_{ref} \cdot f_{XO}}}{K_{PLL}} \right) \text{ and that}$$

$$\phi_{RX1} + \phi_{RX2} = \Delta\phi_{LORX,steady} = -2\pi\Delta f\left(\dfrac{N_{div} + \dfrac{\Delta f - f_{error}}{M_{ref}\cdot f_{XO}}}{K_{PLL}}\right)$$

Gives:

$$d = r + \dfrac{c}{-4\pi\Delta f}\left(\Delta\phi_{LOTX,steady} - \Delta\phi_{LORX,steady}\right)$$

Once more, this is of the form: $d=r+\text{error}_{\Delta\varnothing}$, where the error terms $\text{error}_{\Delta\Phi}$, is expressed in terms of the phase shift, and thus can be estimated suing the Steady State Phase Lag concept.

Thus using the determined total phase shift in a phase-based distance estimation process, PDE, it is possible to convert the total phase shift into a corresponding distance offset, and using the corresponding distance offset, to calculate a distance between a first device comprising the PLL, and a second device, for one-way, or two-way, distance estimation.

From reading the present disclosure, other variations and modifications will be apparent to the skilled person. Such variations and modifications may involve equivalent and other features which are already known in the art of type I PLLs, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of using a type I phase locked loop (PLL) comprising an oscillator and a feedback path to a phase detector, the method comprising:
    locking a first frequency and first relative phase of a first output signal to a frequency and a phase of a first input signal;
    locking a second frequency and second relative phase of a second output signal to a frequency and a phase of a second input signal;
    estimating a steady state phase lag of the PLL resulting from the difference between the first frequency and the second frequency;
    using the estimated steady state phase lag, to determine a total phase shift ($\Delta\Phi_{LO,steady}$) between the second input signal and the second output signal; and
    one operation selected from a group consisting of:
        compensating the PLL for the phase shift, and
        using the determined total phase shift in a distance estimation.

2. The method of claim 1, wherein determining the total phase shift ($\Delta\Phi_{LO,steady}$) comprises further comprises determining a self-resonance frequency, $F_{VCO}$, of the oscillator, and an offset, $F_{ERR}$, between the self-resonance frequency, and a one of the first and second frequencies $F_{PLL}$.

3. The method of claim 1, wherein determining the total phase shift ($\Delta\Phi_{LO,steady}$) comprises determining a PLL gain, $K_{PLL}$.

4. The method of claim 3, wherein determining the total phase shift ($\Delta\Phi_{LO,steady}$) comprises determining an open-loop gain $K_0$ of the oscillator by operating the PLL in an open loop configuration wherein the feedback path is disconnected from the phase detector.

5. The method of claim 4, wherein the PLL gain is equal to the open-loop gain of the oscillator multiplied by a gain, $K_\varphi$, of a phase detector of the PLL.

6. The method of claim 1, wherein the PLL is operable in an open-loop configuration in which an output of the phase detector is replaced by a predetermined pre-charge signal.

7. The method of claim 1, comprising compensating the PLL for the phase shift,
    wherein the feedback path comprises fractional divider configured to be controlled by a sigma-delta modulator,
    and wherein compensating the PLL for the phase shift comprises applying a correction dependent on the total phase shift ($\Delta\Phi_{LO,steady}$) to the fractional divider by the sigma-delta modulator.

8. The method of claim 7,
    wherein applying a correction dependent on the total phase shift ($\Delta\Phi_{LO,steady}$) to the fractional divider by the sigma-delta modulator comprises applying an impulse signal to the sigma-delta modulator.

9. The method of claim 8, wherein PLL is a digital PLL and the impulse comprises a frequency control word, FCW.

10. The method of claim 1, comprising using the determined total phase shift in a phase-based distance estimation process (PDE),
    comprising converting the total phase shift into a corresponding distance offset, and
    using the corresponding distance offset to calculate a distance between a first device comprising the PLL, and a second device.

11. The method of claim 10, wherein the PDE is a one-way PDE, wherein the second frequency is related to the first frequency by a frequency hop.

12. The method of claim 10, wherein the PDE is a two-way PDE, wherein the first frequency is a receiver local oscillator, LO, frequency for a channel, and the second frequency is a transmitter LO frequency for the channel.

13. The method of claim 12, wherein the first frequency differs from the second frequency by an intermediate frequency, $F_{IF}$.

14. The method of claim 3, comprising using the determined total phase shift in a phase-based distance estimation process (PDE) comprising:
    converting the total phase shift into a corresponding distance offset, and
    using the corresponding distance offset to calculate a distance between a first device comprising the PLL, and a second device.

15. The method of claim 14, wherein the PDE is a one-way PDE, and wherein the second frequency is related to the first frequency by a frequency hop.

16. The method of claim 15, wherein the PDE is a two-way PDE, wherein the first frequency is a receiver local oscillator, LO, frequency for a channel, and the second frequency is a transmitter LO frequency for the channel.

17. The method of claim 16, wherein the first frequency differs from the second frequency by an intermediate frequency, $F_{IF}$.

18. An apparatus comprising:
a type-1 phase locked loop (PLL) comprising an oscillator and a selectable feedback path to a phase detector, wherein the PLL is configured to lock a first frequency and first relative phase of a first output signal to a frequency and a phase of a first input signal and to lock a second frequency and second relative phase of a second output signal to a frequency and a phase of a second input signal;
an estimation unit configured to estimate a steady state phase lag of the PLL resulting from the difference between the first frequency and the second frequency;
a determination unit configured to determine a total phase shift ($\Delta\Phi_{LO,steady}$) between the second input signal and the second output signal using the estimated steady state phase lag and to estimate a distance from the determined total phase shift; and
a unit selected from a group consisting of:
a compensation unit configured to compensate the PLL for the phase shift, and
a distance estimation unit configured to use the determined total phase shift in a distance estimation.

19. The apparatus of claim 18, comprising the compensation unit configured to compensate the PLL for the phase shift.

20. The apparatus of claim 18, comprising the distance estimation unit configured to use the determined total phase shift in the distance estimation.

* * * * *